United States Patent [19]
Mens

[11] Patent Number: 4,820,987
[45] Date of Patent: Apr. 11, 1989

[54] MAGNETIC RESONANCE IMAGING APPARATUS COMPRISING AN ACTIVATABLE BIRDCAGE RF COIL

[75] Inventor: Wilhelmus R. M. Mens, Eindhoven, Netherlands

[73] Assignee: U.S. Philips Corporation, New York, N.Y.

[21] Appl. No.: 58,295

[22] Filed: Jun. 5, 1987

[30] Foreign Application Priority Data

Dec. 22, 1986 [NL] Netherlands ........................ 8603251

[51] Int. Cl.⁴ ............................................ G01R 33/20
[52] U.S. Cl. .................................... 324/318; 324/322; 333/221
[58] Field of Search ................ 324/318, 319, 320, 322, 324/311; 333/219, 220, 221; 343/742, 896

[56] References Cited
U.S. PATENT DOCUMENTS 4,564,843  1/1986  Cooper ................................ 343/750
4,694,255  9/1987  Hayes ................................. 324/322
4,717,881  1/1988  Flugan ............................... 324/322

Primary Examiner—Stewart J. Levy
Assistant Examiner—Kevin D. O'Shea

[57] ABSTRACT

A so-called birdcage coil must be quickly deactivated after having generated an RF magnetic field, so as not to disturb the detection of the generated spin resonance signals by the surface coil (or another coil). To this end, semiconductor switches are included in some of the rod conductors of the birdcage coil. The switches are arranged substantially halfway along the rod conductors, because the RF voltage exhibits a zero crossing at that area. As a result, the semiconductor switches can operate with a low voltage. It has been found that the interruption of the rod conductors which are situated in one symmetry half of the birdcage coil and which carry most current in that half suffices for substantial deactivation.

8 Claims, 4 Drawing Sheets

MAGNETIC RESONANCE IMAGING APPARATUS COMPRISING AN ACTIVATABLE BIRDCAGE RF COIL

The invention relates to a magnetic resonance imaging apparatus, comprising a substantially cylindrical RF coil in which a substantially cosinusoidal current distribution can be generated across a circular-cylindrical circumference by means of a number of rod conductors which extend axially along a cylindrical surface.

An RF coil for such a magnetic resonance imaging apparatus is known from U.S. Pat. No. 4,339,718 and is based on the recognition of the fact that a uniform field distribution in such a coil requires a cosinusoidal current distribution along the circumference of the cylindrical coil. Coils of this kind are also referred to as birdcage coils and exist in different versions in such magnetic resonance imaging apparatus. In one embodiment the birdcage coil serves to generate and detect an RF field for generating and measuring magnetic resonance signals in a region of the body of a patient. Such a coil is referred to hereinafter as a body coil. The requirements to be satisfied by such a body coil consist in that it must be capable of generating an RF field in one direction and of supplying a high power. Furthermore, these coils are switched over from the transmitter function to the receiver function; this switching over must be fast.

In another embodiment, the birdcage coil cooperates with a surface coil which is arranged directly on a patient. Such a surface coil can be arranged in different orientations, is RF-sensitive in at least one direction, needs to supply only a weak signal and must often be switched quickly from the deactivated state to the receiving state. This switching over is in the order of 1 millisecond. When the body coil is deactivated (after excitation), the surface coil is activated and vice versa. A final and most important requirement imposed on birdcage coils is that very quick deactivation must be possible in order to prevent the operation of other coils (for example, a surface coil) from being disturbed.

It is an object of the invention to provide a magnetic resonance imaging apparatus which includes an RF birdcage coil which satisfies said requirement. To achieve this, a magnetic resonance imaging apparatus of the kind set forth in accordance with the invention is characterized in that for the deactivation of the RF coil at least a number of the rod conductors are provided with switching means for interrupting the conductance in the rod conductors. As a result of the absence of conductance in at least a number of rod conductors, the looping-through condition applicable to this coil can be disturbed so that a resonant circuit which includes this coil no longer resonates or resonates at a substantially different frequency. The cited looping-through condition is described in detail in the previous, nonpublished Netherlands Patent Application No. 8502273, the priority application for what is now U.S. Pat. No. 4,737,718, granted Apr. 12, 1988.

An embodiment of a magnetic resonance imaging apparatus in accordance with the invention is characterized in that the rod conductors which carry most current during operation of the coil are interrupted in order to detune the coil, the interrupted rod conductors being situated in one symmetry half of the coil.

A preferred embodiment of a magnetic resonance imaging apparatus in accordance with the invention is characterized in that the switching means are arranged substantially halfway along the rod conductors. The interruption of the longitudinal conductors at substantially their halfway point offers the advantage that substantially no RF voltage differences will occur across the switching means. This has the advantage that low-voltage circuits can be used for operating the switching means.

Another embodiment of a magnetic resonance imaging apparatus in accordance with the invention is characterized in that the switching means are formed by PIN diodes.

The invention will be described in detail hereinafter with reference to the accompanying diagrammatic drawing; wherein.

Figure 1:
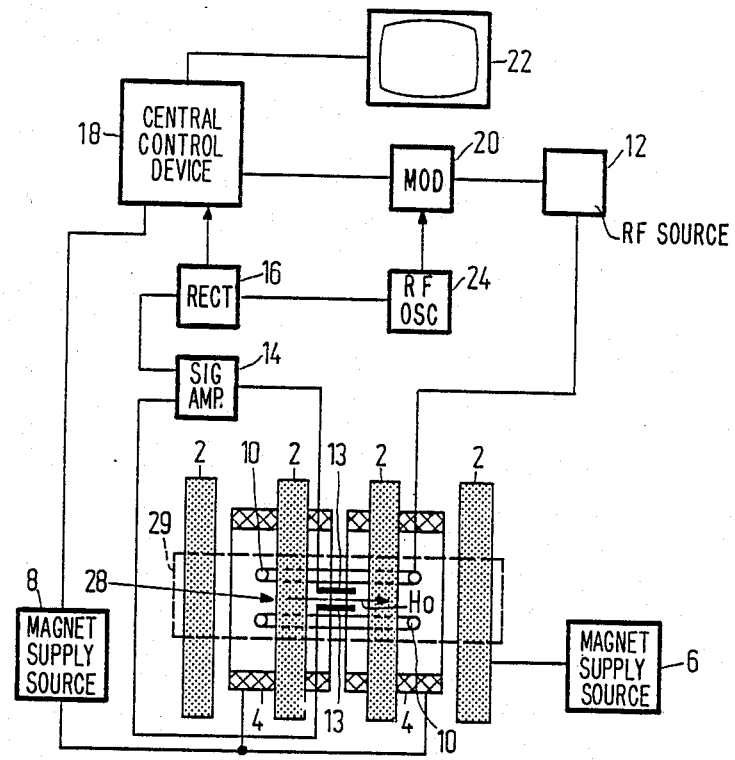
FIG. 1 shows a magnetic resonance imaging apparatus in accordance with the invention.

A magnetic resonance imaging apparatus as shown in FIG. 1 comprises a magnet system 2 for generating a steady magnetic field H0, a magnet system 4 for generating magnetic gradient fields, and supply sources 6 and 8 for the magnet system 2 and the magnet system 4, respectively. An RF magnet coil 10 serves to generate an RF magnetic alternating field; to this end, it is connected to an RF source 12. For detection of spin resonance signals generated in an object to be examined by the RF transmitter field, use is made of a surface coil 13; to this end, the latter coil is connected to a signal amplifier 14. The signal amplifier 14 is connected to a phase-sensitive rectifier 16 which is connected to a central control device 18. The central control device 18 also controls a modulator 20 for the RF source 12, the supply source 8 for the gradient coils, and a monitor 22 for display. An RF oscillator 24 controls the modulator 20 as well as the phase-sensitive rectifier 1 which processes the measurement signals. The transmitter coil 10 which is arranged within the magnet systems 2 and 4 encloses a measurement space 28 which is spacious enough to accommodate a patient to be examined in a medical diagnostic apparatus. Thus, a steady magnetic field H0, gradient fields for selecting object slices, and a spatially uniform RF alternating field are to be generated in the measurement space 28. The RF coil 10 can combine the functions of transmitter coil and measurement coil. For both functions different coils can also be used; for example a surface coil 13 can be used as the measurement coil. In that case quick deactivation of the RF coil 10 and quick activation of a surface coil 13 will be necessary. The RF coil 10 must be deactivated so as not to disturb the detection. The surface coil 13 must be quickly activated in order to minimize the loss of generated RF signals.

Figure 2:
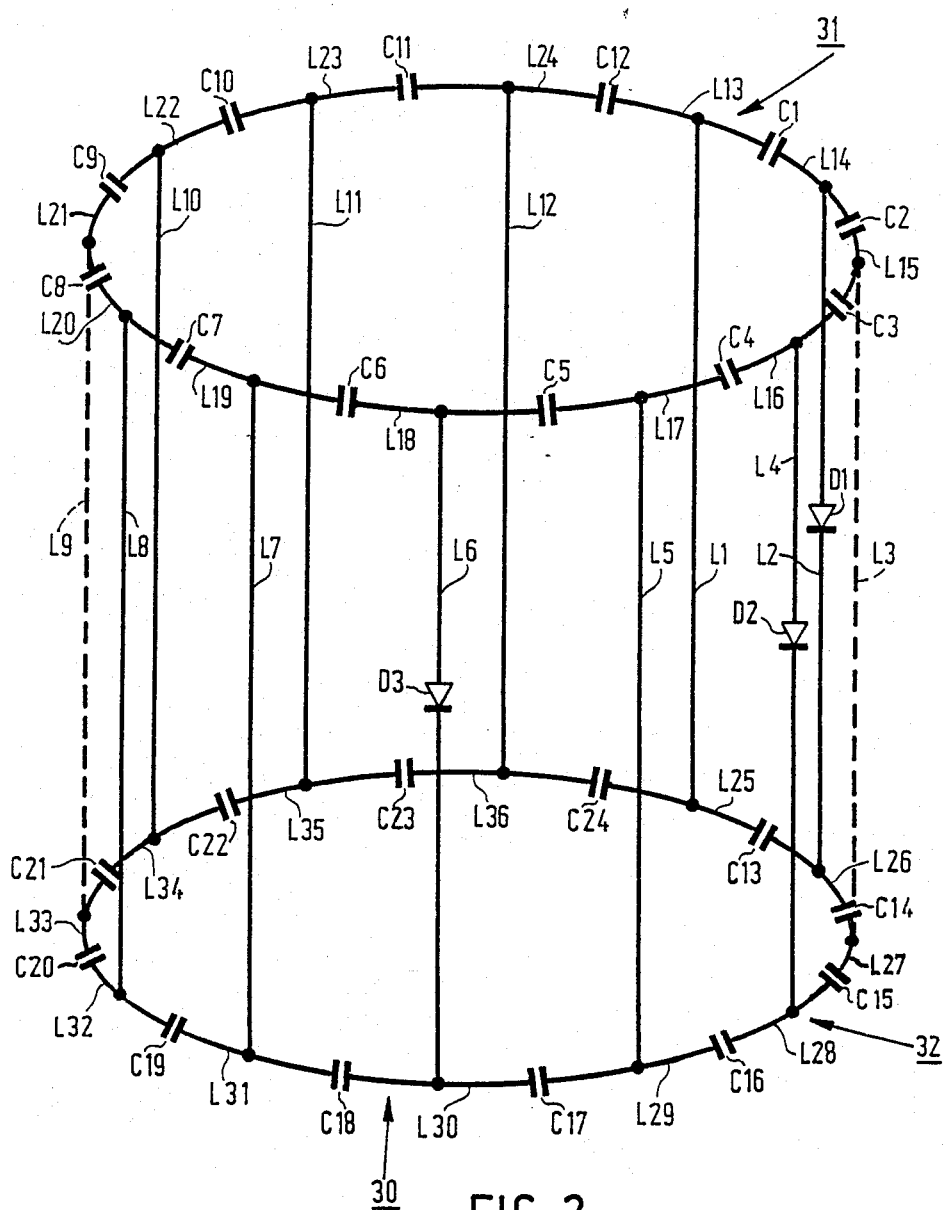
FIG. 2 shows an embodiment of a birdcage coil in accordance with the invention.

FIG. 2 diagrammatically shows an embodiment of a birdcage coil 30 in accordance with the invention. The coil 30 comprises two ring conductors 31 and 32 between which rod conductors are arranged. The rod conductors are arranged on a circular surface of the cylindrical space enclosed by the coil. For each section of the ring conductor in the present embodiment the equivalent diagram of a capacitance and an inductance is connected in series between two rod conductors. The rod conductors form an inductance and are numbered from L1 to L12. When the rod conductors L1 to L12 act as an inductance in the circuit for a given or desired frequency, a given looping-through condition imposes a reactive function for the ring conductor elements between each pair of rod conductors. Because the current distribution along or around the circumference is cosinusoidal, two conductors, L3 and L9 will not conduct a current so that they can be omitted (therefore, L3 and L9 are denoted by broken lines). The reactive elements in a first ring conductor 31 are formed by capacitances which are numbered C1 to C12; the second ring conductor 32 comprises capacitances which are numbered C13 to C24. Furthermore, the ring conductors have an inductive impedance which is represented by inductances L13 to L24 for the first ring conductor and L25 to L36 for the second ring conductor. The values of the capacitances C1 to C24 are substantially equal as are those of the inductances L13 to L36.

In accordance with the invention, some rod conductors, L2, L4 and L6, are provided with switching means D1, D2 and D3 which interrupt the rod conductors when the RF coil shown is to be deactivated. The intended use of the coil determines which rod conductors are to be interrupted. However, in a preferred embodiment the rod conductors carrying the largest current within one symmetry half (i.e. conductors between L6 and L12 in FIG. 2) of the coil are interrupted. Although this represents a substantial deviation from the ideal case where all rod conductors are interrupted, this has been found to be an optimum solution in practice.

Figure 3:
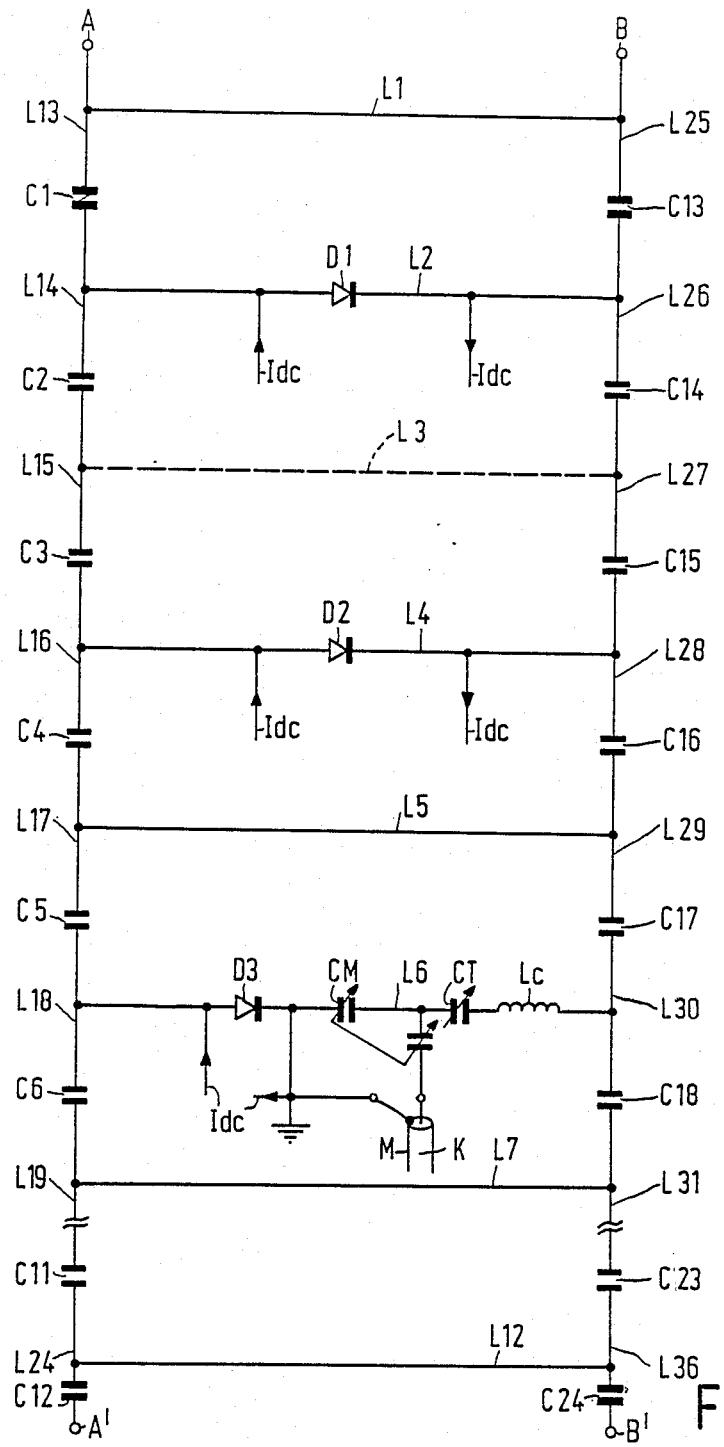
FIG. 3 shows an electrical equivalent diagram of the deactivatable RF coil shown in FIG. 2.

FIG. 3 shows an electrical equivalent diagram of an embodiment of a 64-MHz birdcage coil. Only a part of the coil of FIG. 2 is shown; the parts which correspond to FIG. 2 are denoted by corresponding reference numerals. It is to be noted that the points A and B should be short-circuited to the points A' and B', respectively, for an electrical representation of the cylindrical coil shape of FIG. 2. In order to deactivate the coil 30, PIN diode switches D1, D2, D3 are inserted in the rod conductors L2, L4 and L6, a forward current Idc being passed through said diodes when the coil is deactivated. The diode switches D1, D2 and D3 will be described in detail hereinafter.

The RF energy for the coil shown in FIG. 3 is supplied via a coaxial cable K which is connected to the conductor L6 via a matching capacitance CM. A desired resonant frequency can be adjusted by means of a tuning capacitance CT. In order to compensate for a capacitive impedance caused by the tuning and matching capacitances CT and CM, a compensation coil Lc is connected in series therewith, so that the conductor L6 and the components connected thereto together form the same impedance again as the conductors L1, L2, L4, L5 etc.

Figure 4:
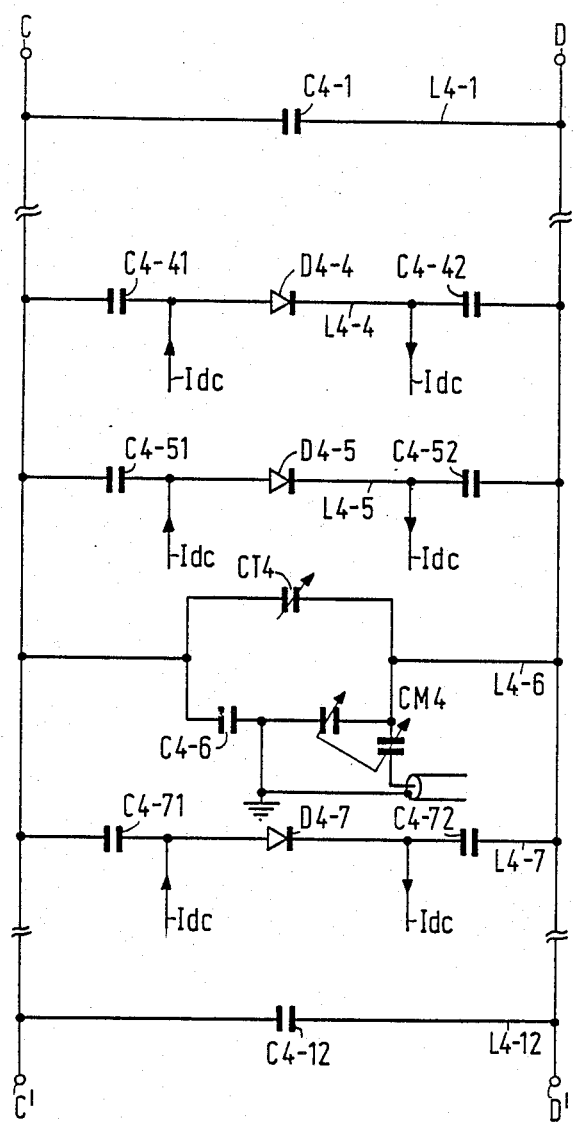
FIG. 4 shows an electrical equivalent diagram of a further deactivatable coil.

FIG. 4 shows a further embodiment of a birdcage coil in accordance with the invention. Therein, a capacitance C4-1, C4-12 is connected in series with the rod conductors L4-1, L4-12, said capacitances preferably being provided halfway along the rod conductors L4-1, L4-12 (the conductors L4-3 and L4-9 are again absent in this embodiment). The construction of the conductors L4-2, L4-8, L4-10 and L4-11 is the same as that of the conductor L4-12, but they are not shown in FIG. 4. When the capacitance C4-1 amounts to 50 pF, two capacitances C4-41 and C4-42, C4-51 and C4-52, and C4-71 and C4-72 are connected in series with a respective semiconductor diode switch D4-4, D4-5 and D4-7 in the conductors L4-4, L4-5 and L4-7. The diode switches D4-4, D4-5 and D4-7 are activated by application of a current, so that the series connection of the conductors L4-4, L4-5 and L4-7 and the capacitances C4-41 and C4-42, C4-51 and C4-52, C4-71 and C4-72 is interrupted. It is to b noted that, because each time two capacitances are connected in series in the conductors L4-4, L4-5 and L4-7, each of these capacitances should have a value of 100 pF. The RF power is applied to the conductor L4-6 via a coaxial cable K4 and a matching capacitance CM4. For reasons of symmetry, the capacitance CM4 is connected in series with a substantially equal capacitance C4-6. A tuning capacitance CT4 is connected parallel to the capacitances CM4 and C4-6 in order to adjust the desired resonant frequency (the tuning capacitance has a value of, for example 30 pF; the capacitance C4-6 then has the value 40 pF, like the two parts of the matching capacitance CM4). It is also to be noted that in the electrical diagram of the birdcage coil shown in FIG. 4 the extremities C and D should be short-circuited to the extremities C' and D' respectively.

Figure 5:
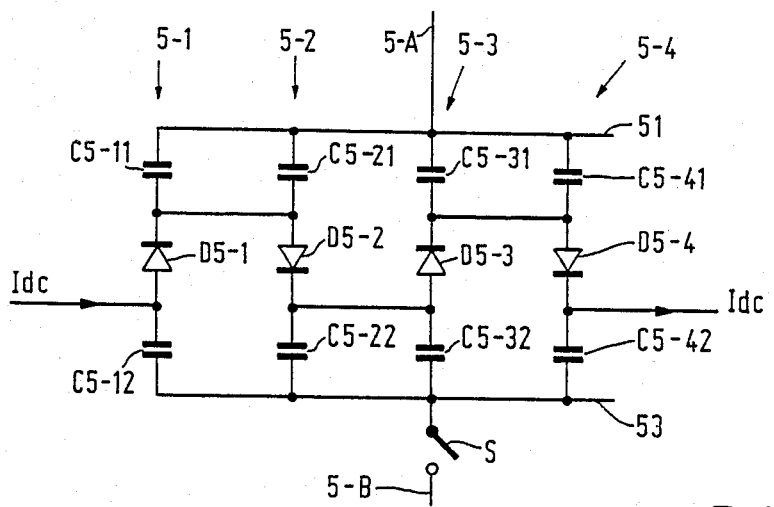
FIG. 5 shows an electrical diagram of the electronic switch.

FIG. 5 shows an embodiment of a diode switch which is suitable for use in the coils shown in the FIGS. 3 and 4. The switch comprises branches 5-1, 5-2, 5-3 and 5-4 which are connected in parallel between two conductors 51 and 53 and each of which comprises a series connection of a first capacitance, a PIN diode, and a second capacitance. The conductors 51 and 53 are connected to the extremities 5-A and 5-B of one of the conductors shown in the FIGS. 3 or 4. The current Idc which serves to "open" the switch is applied to the first branch 5-1, between the capacitance C5-12 and the diode D5-1. In the general case, where "i" is an integer, the cathode of the diode D5-i in the branch 5-i is connected to the anode of the diode D5-(i+1), so that they are connected in series for a direct current for activation and deactivation. The configuration shown offers the advantage that, when the switch is arranged halfway along the conductors (see, for example FIG. 2), the diode switch can operate at a low voltage due to the RF voltage variation across such a rod conductor, exhibiting a zero crossing halfway along the conductor, and the RF signal voltages in the coil, so that it is not necessary to use RF chokes. It is also to be denoted that, when the switch is not "open", the PIN diodes D5-1, D5-2, D5-3 and D5-4 are connected in parallel for the RF signal currents. The capacitances C5-11, C5-12, C5-21, ... C5-42 are chosen to be so high that they form a negligibly small impedance for the resonant frequency of the birdcage coil.

It is also possible to connect an electromechanical switch S in series with the semiconductor diode switch, said electromechanical switch being relatively slow in comparison with the semiconductor switch but capable of withstanding a larger voltage drop across the opened contacts.

Various alternative versions of the semiconductor switch are feasible; for example, in order to decrease the series impedance thereof, a few additional branches could be connected between the conductors 51 and 53 (in that case the branches having an odd index comprise the same components and have the same orientation; the same is applicable to the branches having an even index). The branches 5-3 and 5-4 could also be omitted in order to save components.

A further saving as regards components could be achieved by omitting the capacitances C5-11 and C5-41, by replacing the capacitances C5-12 and C5-22 as well as the capacitances C5-32 and C5-42 by a capacitance between the anode of the diode D5-1 and the cathode of the diode D5-2 as well as between the anode of the diode D5-3 and the diode D5-4, and by connecting the switch S directly to the diodes D5-2 and D5-3.

What is claimed is:

1. A magnetic resonance imaging apparatus comprising:
   an RF coil having a substantially cylindrical shape and in which a substantially cosinusoidal current distribution can be generated around the circumference of said cylindrical shape,
   a number of rod conductors which extend axially along a surface of said cylindrical shape,
   wherein for the deactivation of said RF coil at least selected ones of said rod conductors are provided with switching means for interrupting the conductance in the rod conductors.

2. A magnetic resonance imaging apparatus as claimed in claim 1, wherein the rod conductors which carry most current in the case of resonance are the ones selected to be interrupted for deactivation, the interrupted rod conductors being situated in one half of the coil.

3. A magnetic resonance imaging apparatus as claimed in claim 1, wherein the switching means are electronic switching means.

4. A magnetic resonance imaging apparatus as claimed in any one of the claims 1-3, wherein the switching means are arranged halfway along the rod conductors.

5. A magnetic resonance imaging apparatus as claimed in any one of claims 1-3, characterized in that the switching means are PIN diode switches.

6. A magnetic resonance imaging apparatus as claimed in claim 3 wherein electromechanical switches are connected in series with PIN diode switches.

7. A magnetic resonance imaging apparatus as claimed in claim 3 wherein the switching means are PIN diode switches and each PIN diode switch is an RF parallel connection and D-C series connection of at least two PIN diodes.

8. A magnetic resonance imaging apparatus as claimed in claim 1, characterized in that the switching means comprise a number of parallel connected branches, each of which comprises a series connection of a first capacitance, a PIN diode and a second capacitance, the PIN diode in the branches having an odd index being connected in the opposite sense with respect to the PIN diode in the branches having an even index, it being possible to apply a current to an anode of a PIN diode in the first branch which can be output via the cathode of the PIN diode in the branch having the highest index, the cathode of the diode in a branch having the index i always being connected to the anode of the PIN diode in the branch having the index i+1, the sides of the capacitances of the switch which are remote from the PIN diodes forming connection points for the rod conductors of the coil.

* * * * *